United States Patent [19]
Arai et al.

[11] Patent Number: 5,902,472
[45] Date of Patent: May 11, 1999

[54] AQUEOUS SOLUTION FOR FORMING METAL COMPLEXES, TIN-SILVER ALLOY PLATING BATH, AND PROCESS FOR PRODUCING PLATED OBJECT USING THE PLATING BATH

[75] Inventors: Susumu Arai, Okaya; Tohru Watanabe, Atsugi; Mitsutoshi Higashi, Nagano, all of Japan

[73] Assignee: Naganoken and Shinko Electric Industries Co., Ltd., Nagano, Japan

[21] Appl. No.: 08/930,514

[22] PCT Filed: Jan. 30, 1997

[86] PCT No.: PCT/JP97/00209
§ 371 Date: Sep. 30, 1997
§ 102(e) Date: Sep. 30, 1997

[87] PCT Pub. No.: WO97/28296
PCT Pub. Date: Aug. 7, 1997

[30] Foreign Application Priority Data

Jan. 30, 1996 [JP] Japan .................................. 8-037496
Mar. 4, 1996 [JP] Japan .................................. 8-075245

[51] Int. Cl.⁶ .................................. C25D 5/02; C25D 3/56
[52] U.S. Cl. ................ 205/125; 205/252; 205/253; 205/254; 106/1.25; 106/1.27
[58] Field of Search .................................. 205/252, 253, 205/254, 263, 125; 106/1.25, 1.27

[56] References Cited

U.S. PATENT DOCUMENTS

| 4,072,605 | 2/1978 | Thelander | 210/50 |
| 5,225,096 | 7/1993 | Ahmed et al. | 252/94 |
| 5,711,866 | 1/1998 | Lashmore et al. | 205/687 |

*Primary Examiner*—Kishor Mayekar

[57] ABSTRACT

A tin-silver alloy plating solution having a tin compound, a silver compound, and a complexing agent including a pyrophosphoric compound and an iodic compound. The tin-silver alloy layer composition can achieve a high electric current efficiency without using harmful compounds such as cyanides. The plating solution is very stable, possesses adhesivability, and the solder-wettability of the tin-silver alloy layer is satisfactory. Also, the alloy is an advantageous alloy for solder plating.

17 Claims, No Drawings

AQUEOUS SOLUTION FOR FORMING METAL COMPLEXES, TIN-SILVER ALLOY PLATING BATH, AND PROCESS FOR PRODUCING PLATED OBJECT USING THE PLATING BATH

This application is a 35 U.S.C 371 National Stage filing of PCT/JP/00209, filed on Jan. 30, 1997.

FIELD OF TECHNOLOGY

The present invention relates to aqueous solution for forming a metallic complex, tin-silver alloy plating solution, and a method of plating with to said plating solution.

BACKGROUND OF THE INVENTION

A technology of forming metals into metallic complexies are an essential technology in fields of plating, analyzing, etc. Conventionally, cyanides, ammonia, organic acids, etc. are used as complexing agents. But, there is no complexing agent which is effective for all metals; and it is difficult to treat waste water with cyanides, which are relatively effective among said agents, due to the harmful effect to human bodies. Thus, a complexing agent, which is capable of effectively complexing many metals without damaging human health, is required.

On the other hand, pollution of underground water by lead is a type of environmental pollution, and thus products containing lead are severely restricted, such that tin-lead solder is replaced by lead-free solder. Thus, plating layers coated with tin-lead solder should be replaced by lead-free solder.

Thus, tin-silver alloy is to be employed instead of tin-lead solder alloy, and Matsushita Electric Company has disclosed the use of tin-silver solder paste (see Nikken Sangyo Press, Feb. 1, 1996). A method of forming a tin-silver solder layer by plating is now required. The tin-silver alloy has anti-sulphurizability, so it is employed instead of silver.

The difference of electrodeposition potential between silver and tin is 900 mV or more as standard oxidation-reduction potential. Cyanide, e.g., potassium cyanide, is included in the plating solution so as to codeposite tin and silver when forming the tin-silver alloy layer. With the cyanide, there are many problems, including polluting waste water, safe work, etc., so that a tin-silver plating solution including no cyanides is required.

An object of the present invention is to provide an aqueous solution for forming metallic complexes which do not contain cyanides; a tin-silver alloy plating solution, wherein, the composition can be optionally changed; and a method of plating in said plating solution.

DISCLOSURE OF THE INVENTION

To achieve the above objects, the aqueous solution for forming metallic complex should include at least a pyrophosphoric compound and an iodic compound as a basic composition.

The pyrophosphoric compound may include: pyrophosphate, e.g., potassium pyrophosphate, sodium pyrophosphate; and/or pyrophosphoric acid.

The iodic compound may include: iodide, e.g., potassium iodide, sodium iodide; iodite, e.g., potassium iodite, sodium iodite; and/or iodine.

The tin-silver alloy plating solution comprises at least a tin compound, a silver compound, and a complexing agent including a pyrophosphoric compound and an iodic compound as a basic composition.

In the plating solution too, the pyrophosphoric compound may include: pyrophosphate, e.g., potassium pyrophosphate, sodium pyrophosphate; and/or pyrophosphoric acid.

The iodic compound, too, may include: iodide, e.g., potassium iodide, sodium iodide; iodite, e.g., potassium iodite, sodium iodite; and/or iodine.

The a tin compound may be tin compound of an inorganic acid or a tin compound of an organic acid, which is selected from following tin compounds: tin chloride; tin sulfate; tin pyrophosphate; tin iodide; stannic acid; potassium stannate; tin acetate; tin methanesulfonate; tin alkanolsulfonate; and tin phenolsulfonate.

The silver compound may be a silver compound of an inorganic acid or a silver compound of an organic acid, which is selected from following silver compounds: silver iodide; silver chloride; silver nitrate; silver sulfate; silver pyrophosphate; silver iodate; silver acetate; silver methanesulfonate; silver alkanolsulfonate; and silver phenolsulfonate.

The amount of the pyrophosphoric compound and the iodic compound is provided to maintain tin and silver, as complex ions, in the plating solution.

The method of electrolytic plating as defined by the present invention is characterized by plating a work in a plating solution comprising: a tin compound; a silver compound; and a complexing agent including a pyrophosphoric compound and an iodic compound, whereby the work is plated with a tin-silver alloy.

The method of plating according to the present invention comprises the steps of: forming a resin layer on a surface of a work; forming the resin layer into a prescribed pattern as a plating mask; executing electrolytic plating on the surface of the work in a plating solution comprising: a tin compound; a silver compound, and a complexing agent including a pyrophosphoric compound and an iodic compound, whereby the work is plated with the tin-silver alloy.

The resin layer may be a layer of photosensitive resin, and the photosensitive resin layer may be formed into a prescribed pattern by photolithography.

The work may be a semiconductor chip, and the connecting terminals (bumps) may be plated with the tin-silver alloy.

The work may be a substrate including printed circuits, and connecting terminals (bumps), which are connected with the printed circuits and are plated with the tin-silver alloy.

The method may further comprise the step of heat-treating the plating portion of the work, the plating portion being preferably formed into a hemispheric bump.

The pyrophosphoric compound may include pyrophosphate, e.g., potassium pyrophosphate, sodium pyrophosphate, and/or pyrophosphoric acid.

The iodic compound may include: iodide, e.g., potassium iodide, sodium iodide; iodite, e.g., potassium iodite, sodium iodite; and/or iodine.

The tin compound may be a tin compound of an inorganic acid or a tin compound of an organic acid, which is selected from following tin compounds: tin chloride; tin sulfate; tin pyrophosphate; tin iodide; stannic acid; potassium stannate; tin acetate; tin methanesulfonate; tin alkanolsulfonate; and tin phenolsulfonate.

The silver compound may be a silver compound of an inorganic acid or a silver compound of an organic acid, which is selected from following silver compounds: silver iodide; silver chloride; silver nitrate; silver sulfate; silver pyrophosphate; silver iodate; silver acetate; silver methanesulfonate; silver alkanolsulfonate; and silver phenolsulfonate.

THE BEST MODE OF THE INVENTION

In the aqueous solution for forming metallic complexes, a prescribed amount of pyrophosphate is added so as to preferably establish the molarity of the pyrophosphoric ions, with respect to that of the metal as at least an equivalent molarity, which corresponds to the coordination number of said metal, so that the pyrophosphoric complex ions of said metal can be more stabilized.

Also, in the tin-silver alloy plating solution, a prescribed amount of pyrophosphate is added to the metal which corresponds to the coordination number of said metal, so that the pyrophosphoric complex ions of said metal can be more stabilized. The Pyrophosphate is added preferably at at least 2-times the molarity of the tin.

Pyrophosphate, e.g., potassium pyrophosphate, sodium pyrophosphate, and/or pyrophosphoric acid may be employed as the pyrophosphoric compound.

In the aqueous solution for forming metallic complexes, the amount of the iodic compound can be optionally changed within a range in which the complex ions of the metal can stably exist. The density of the iodine ions ($I^-$) is made to be at least 0.5 mol/l so as to more stabilize the complex ions of the iodic compound of the metal. Preferably, the density of iodine ions ($I^-$) is at least 1.5 mol/l.

In the plating solution too, the amount of the iodic compound can be optionally changed within a range in which the complex ions of silver can stably exist. The density of the iodine ions ($I^-$) is 0.5 mol/l or more so as to stabilize the complex ions of the iodic compound of silver. Preferably, the density of iodine ions ($I^-$) is 1.5 mol/l or more.

Iodide, e.g., potassium iodide, sodium iodide, iodite, e.g., potassium iodite, sodium iodite, and iodine may be solely employed as the iodic compound or a mixture of two or more may be employed as the iodic compound.

The pH of the aqueous solution and the plating solution can be adjusted by adding an acid, e.g., pyrophosphoric acid, hydrochloric acid, and/or an alkali, e.g., potassium hydroxide, sodium hydroxide. The preferred range of the solution pH is 5–10, but the pH may be in a range in which the pyrophosphoric compound and the iodic compound do not deteriorate or change in quality.

In the aqueous solution, the complexies of one or more metals, e.g., nickel, bismuth, copper, zinc, tin, silver, can be formed. Glycine, tartrate, oxalate, citrate, sulfite, thiosulfate, saccharin, butynediol, formaldehyde, polyethylene glycol, sodium lauryl sulfate, polyoxyethylenenonylphenylether, dicyclohexylammonuimnitrite, etc. may be solely or jointly added to the aqueous solution on the basis of purpose.

In the plating solution, glycine, tartrate, oxalate, citrate, sulfite, thiosulfate, saccharin, butynediol, formaldehyde, polyethylene glycol, sodium lauryl sulfate, polyoxyethylenenonylphenylether, dicyclohexylammonuimnitrite, etc. may be solely or jointly added to the plating solution on the basis of purpose.

Further, complexing agents, brighteners, antioxidants, surface-active agents, etc. may be added to the solution. Oxalate, sulfite, thiosulfate, tartrate, etc. may be solely or jointly added as the complexing agents.

Also, Peptone, β-naphthol, aminoaldehyde, formaldehyde, acetaldehyde, polyethylene glycol, acrylic acid, methyl acrylate, bismuth oxide, triethanolamine, 2-diethylaminoethanol, salicylic acid, N,N-dimethylformaldehyde, hexaethylenetetraamine, malonic acid, etc. may be solely or jointly added as the brightener.

Especially, L-ascorbic acid, phenol, hydroquinone, resorcin, etc. may be solely or jointly added as the antioxidant for the tin.

Sodium lauryl sulfate, polyoxyethylenenonylphenylether, benzalkonium chloride, etc. may be solely or jointly added as the surface-active agents.

The tin compound of the tin-silver alloy plating solution is not limited, so a tin compound of an inorganic acid or a tin compound of an organic acid such as tin chloride, tin chloride 2 hydrate, tin sulfate, tin pyrophosphate, stannic acid, tin methanesulfonate, may be solely employed; mixture of two or more may be employed.

The silver compound of the tin-silver alloy plating solution is not limited, so a silver compound of an inorganic acid or a silver compound of an organic acid such as silver iodide, silver chloride, silver nitrate, silver sulfate, silver methanesulfonate, may be solely employed or a mixture of two or more may be employed.

The blending ratio of the silver compound and the tin compound in the tin-silver alloy plating solution may be defined as optional. In the case of forming an alloy layer which includes much silver, the ratio of the silver compound should be greater. In the case of forming an alloy layer which includes much tin, the ratio of the tin compound should be greater.

In the tin-silver alloy plating solution, the composition of the alloy layer can be changed by changing the electric current density, etc., so that many kinds of alloy layers can be formed in the same plating solution. In the same solution, the more the current density is increased, the less the amount of silver in the alloy layer is reduced. The composition of the alloy layer is fixed if the current density is at prescribed value or more.

Ordinary electroplating can be executed in the tin-silver alloy plating solution. For example, direct current plating, pulse plating, and periodical reverse current plating can be executed in the plating solution. The plating may be executed under the following conditions: the temperature of the plating solution is, for example, 20–80° C. and the solution can be stirred or not stirred. In galvanostatic or potentiostatic electrolysis, for example, tin, silver, tin-silver alloy, platinum, titanium plated with platinum, and carbon may be used as an anode.

Works to be plated are not limited, and thus any materials which are capable of being electrically plated may be employed as the works.

EMBODIMENTS

Embodiments of the aqueous solution for forming metallic complex bodies will be explained in Embodiments 1–4 and embodiments of the tin-silver alloy plating solution and the method of plating in the plating solution will be explained in Embodiments 5–28. However, the present invention is not limited to these embodiments, and the composition of the aqueous solution for forming metallic complexies and compositions and plating conditions of the tin-silver alloy plating solution may be optionally changed according to desired purposes.

Embodiment 1

| | |
|---|---|
| $K_4P_2O_7$ | 165 g/l |
| KI | 166 g/l |

An aqueous solution for forming metallic complexes including the above compounds is prepared. 53 g of $NiSO_4.6H_2O$ and 2.4 g of $AgNO_3$ are added to an aqueous solution. All of the metals are dissolved therein to form complexes. The aqueous solution is a transparent and yellow solution. The pH is 9.1. The external appearance of the aqueous solution is maintained for more than one month.

Embodiment 2

| | |
|---|---|
| $K_4P_2O_7$ | 165 g/l |
| KI | 250 g/l |

An aqueous solution for forming metallic complexes including the above compounds is prepared. 12.5 g of $CuSO_4.5H_2O$ and 4.7 g of AgI are added to the aqueous solution. All of the metals are dissolved therein as to form complex ions. The aqueous solution is a transparent and deep blue solution. The pH is 9.2. An external appearance of the aqueous solution is maintained for more than one month.

Embodiment 3

| | |
|---|---|
| $K_4P_2O_7$ | 165 g/l |
| KI | 330 g/l |

An aqueous solution for forming metallic complexes including the above compounds is prepared. The aqueous solution is a colorless and transparent solution and the external appearance is maintained for more than three months. The pH is 8.9. 42 g of $SnP_2O_7$, 0.5 g of $CuP_2O_7$ and 1.2 g of AgI are added to the aqueous solution. All of the metals are dissolved therein as complex ions; the aqueous solution becomes a transparent and light blue solution. The external appearance of the aqueous solution is maintained for more than three months without deposition, etc.

Embodiment 4

| | |
|---|---|
| $K_4P_2O_7$ | 180 g/l |
| KI | 350 g/l |

An aqueous solution for forming metallic complexes including the above compounds is prepared. The aqueous solution is a colorless and transparent solution which maintains its external appearance for more than three months. The pH is 9.0. 42 g of $SnP_2O_7$, 1.5 g of $ZnSO_4.7H_2O$ and 0.5 g of AgI are added to the aqueous solution. All of the metals are dissolved therein as complex ions. The aqueous solution is a colorless and transparent solution. The external appearance of the aqueous solution is maintained for more than three months without deposition, etc.

Embodiment 5

| | |
|---|---|
| $SnCl_2.2H_2O$ | 45 g/l |
| $K_4P_2O_7$ | 200 g/l |
| AgI | 1.2 g/l |
| KI | 330 g/l |

A tin-silver alloy plating solution, including the above compounds is prepared. The plating solution is a colorless and transparent solution and the external appearance thereof is maintained for more than three months without deposition, etc. The pH is 8.9. Pure copper substrates are electroplated with direct current and in the plating solution at a temperature of 25° C. with no stirring and a cathodic current density of 0.1–1 $A/dm^2$. The amount of silver (WT %) in a tin-silver alloy layer, the current efficiency and the external appearance of the alloy layer with respect to the current density are shown in TABLE 1. According to the TABLE, the tin-silver alloy layer, which includes 5–19% of silver, can be formed with a high current efficiency in the plating solution.

TABLE 1

| Current Density ($A/dm^2$) | 0.1 | 0.3 | 0.5 | 0.7 | 0.9 |
|---|---|---|---|---|---|
| Amount of Silver (%) | 19 | 10 | 7 | 6 | 5 |
| Current Efficiency (%) | 82 | 90 | 85 | 88 | 84 |
| External appearance | half bright | half bright | dull | dull | dull |

Embodiment 6

| | |
|---|---|
| $SnCl_2.2H_2O$ | 45 g/l |
| $K_4P_2O_7$ | 200 g/l |
| AgI | 4.7 g/l |
| KI | 330 g/l |

A tin-silver alloy plating solution including the above compounds is prepared. The plating solution is a colorless and transparent solution and the external appearance thereof is maintained for more than three months without deposition, etc. The pH is 8.9. Pure copper substrates are electroplated with direct current in the plating solution at a temperature of 25° C. with no stirring and a cathodic current density of 0.1–1 $A/dm^2$. Amount of silver (WT %) in a tin-silver alloy layer, the current efficiency and the external appearance of the alloy layer with respect to the current density are shown in TABLE 2. According to the TABLE, the tin-silver alloy layer, which includes 20–75% of silver, can be formed with a high current efficiency in the plating solution.

TABLE 2

| Current Density ($A/dm^2$) | 0.1 | 0.3 | 0.5 | 0.7 | 0.9 |
|---|---|---|---|---|---|
| Amount of Silver (%) | 75 | 39 | 25 | 20 | 18 |
| Current Efficiency (%) | 60 | 82 | 86 | 90 | 89 |
| External appearance | dull | dull | half bright | half bright | half bright |

Embodiment 7

| | |
|---|---|
| $Sn_2P_2O_7$ | 74 g/l |
| $K_4P_2O_7$ | 120 g/l |
| AgI | 4.7 g/l |
| KI | 330 g/l |

A tin-silver alloy plating solution, including the above compounds is prepared. The plating solution is a colorless and transparent solution the pH is 7.0, and the external appearance is maintained for more than one month without deposition, etc. Pure copper substrates are electroplated with direct current and in the plating solution at a temperature of 25° C. with no stirring and cathodic current density 0.1–1 A/dm². The amount of silver (WT %) in a tin-silver alloy layer, the current efficiency and the external appearance of the alloy layer with respect to the current density are shown in TABLE 3. According to the TABLE, the tin-silver alloy layer, which includes 20–75% of silver, can be formed with high current efficiency in the plating solution.

TABLE 3

| Current Density (A/dm²) | 0.1 | 0.3 | 0.5 | 0.7 | 0.9 |
|---|---|---|---|---|---|
| Amount of Silver (%) | 72 | 46 | 26 | 20 | 18 |
| Current Efficiency (%) | 83 | 94 | 95 | 92 | 93 |
| External appearance | dull | dull | half bright | half bright | half bright |

Embodiment 8

| | |
|---|---|
| $Sn_2P_2O_7$ | 103 g/l |
| $K_4P_2O_7$ | 330 g/l |
| AgI | 1.2 g/l |
| KI | 330 g/l |

A tin-silver alloy plating solution including the above compounds is prepared. The plating solution is a colorless and transparent solution the pH is 8.9, and the external appearance is maintained for more than one month without deposition, etc. Pure copper substrates are electroplated with direct current and in the plating solution at a temperature of 25° C. with no stirring and a cathodic current density of 0.2–2.2 A/dm². The amount of silver (WT %) in a tin-silver alloy layer, the current efficiency and the external appearance of the alloy layer with respect to the current density are shown in TABLE 4. According to the TABLE, the tin-silver alloy layer, which includes 2–18% of silver, can be formed with a high current efficiency in the plating solution. Especially, in tin-silver solder, the preferable amount of the silver is about 3.5% due to melting point. In the present embodiment, the tin-silver alloy layer including 2–5% of silver can be formed in a range of the current density of 0.8–2.2 A/dm².

TABLE 4

| Current Density (A/dm²) | 0.2 | 0.8 | 1.0 | 1.5 | 2.2 |
|---|---|---|---|---|---|
| Amount of Silver (%) | 18 | 3.5 | 3.1 | 2.5 | 2.0 |
| Current Efficiency (%) | 88 | 99 | 99 | 100 | 95 |
| External appearance | dull | dull | dull | dull | dull |

Embodiments 9–13

The plating solution of the embodiments of 9–13 are shown in TABLE 5 (unit of amount of compounds: g/l). All the plating solutions of the embodiments are colorless and transparent and maintain their external appearances for more than one month.

TABLE 5

| Embodiment | 9 | 10 | 11 | 12 | 13 |
|---|---|---|---|---|---|
| $Sn_2P_2O_7$ | 103 | 103 | 103 | 103 | 103 |
| $K_4P_2O_7$ | 330 | 330 | 330 | 330 | 330 |
| AgI | 1.2 | 2.4 | 3.6 | 4.8 | 6.0 |
| KI | 332 | 332 | 332 | 332 | 332 |

Pure copper substrates are electroplated with direct current in the plating solution of each embodiment under the conditions of a cathodic current density of 0.1–2.5 A/dm²; a temperature of 45° C. with no stirring and using a platinum anode. The amount of silver (WT %) in the tin-silver alloy layers and the external appearances thereof (Δ is gray and not glossy; ○ is white and not glossy; and ☽ is white and half glossy), with respect to each current density are shown in TABLEs 6–9. In all embodiments, the current efficiency is 90% or more.

TABLE 6

Current Density = 0.1 A/dm²

| | 9 | 10 | 11 | 12 | 13 |
|---|---|---|---|---|---|
| Amount of Silver (%) | 5.5 | 7.8 | 10.5 | 15.1 | 17.0 |
| External Appearance | Δ | Δ | Δ | Δ | Δ |

TABLE 7

Current Density = 0.5 A/dm²

| | 9 | 10 | 11 | 12 | 13 |
|---|---|---|---|---|---|
| Amount of Silver (%) | 2.0 | 3.3 | 5.5 | 7.9 | 9.9 |
| External Appearance | Δ | Δ | Δ | Δ | Δ |

TABLE 8

Current Density = 1.0 A/dm²

| | 9 | 10 | 11 | 12 | 13 |
|---|---|---|---|---|---|
| Amount of Silver (%) | 1.8 | 3.2 | 5.0 | 7.4 | 9.7 |
| External Appearance | ○ | ○ | ○ | ○ | Δ |

TABLE 9

Current Density = 2.0 A/dm²

| | 9 | 10 | 11 | 12 | 13 |
|---|---|---|---|---|---|
| Amount of Silver (%) | 1.7 | 2.7 | 4.9 | 6.7 | 8.4 |
| External Appearance | ○ | ○ | ○ | ○ | Δ |

Embodiment 14

| | |
|---|---|
| $Na_4P_2O_7 \cdot 10H_2O$ | 224 g/l |
| $SnCl_2 \cdot 2H_2O$ | 45.2 g/l |
| $AgNO_3$ | 0.5 g/l |
| KI | 250 g/l |

A tin-silver alloy plating solution including the above compounds is prepared. The plating solution is a colorless and transparent solution with a pH=8.2. Pure copper substrates are electroplated, with direct current, in the plating solution at a temperature of 60° C. with no stirring and a cathodic current density of 0.1–2.5 A/dm$^2$. The amount of silver (WT %) in the tin-silver alloy layer, the current efficiency and the external appearance of the alloy layer (Δ is gray and not glossy; ○ is white and not glossy; and ☉ is white and half glossy) with respect to the current density are shown in TABLE 10. According to the TABLE, the tin-silver alloy layer, which includes 1.5–6.2% of silver, can be formed in the plating solution.

TABLE 10

| Current Density (A/dm$^2$) | 0.1 | 0.2 | 1.0 | 2.0 | 2.5 |
|---|---|---|---|---|---|
| Amount of Silver (%) | 6.2 | 4.0 | 2.1 | 1.7 | 1.5 |
| External Appearance | ○ | ○ | ○ | ○ | ○ |

Embodiment 15

| | |
|---|---|
| $K_4P_2O_7$ | 166 g/l |
| $SnCl_2 \cdot 2H_2O$ | 45.2 g/l |
| $Ag_2SO_4$ | 0.42 g/l |
| KI | 250 g/l |

A tin-silver alloy plating solution including the above compounds is prepared. The plating solution is a colorless and transparent solution with a pH=9.0. Pure copper substrates are electroplated with direct current in the plating solution at a temperature of 80° C. with no stirring and a cathodic current density of 0.5–3.0 A/dm$^2$. The amount of silver (WT %) in the tin-silver alloy layer, the current efficiency and the external appearance of the alloy layer (Δ is gray and no glossy; ○ is white and no glossy; and ☉ is white and half glossy) with respect to the current density are shown in TABLE 11. According to the TABLE, the tin-silver alloy layer, which includes 2.5–4.8% of silver, can be formed in the plating solution.

TABLE 11

| Current Density (A/dm$^2$) | 0.5 | 1.0 | 1.5 | 2.0 | 3.0 |
|---|---|---|---|---|---|
| Amount of Silver (%) | 4.9 | 3.6 | 3.3 | 2.8 | 2.5 |
| External Appearance | ○ | ○ | ○ | Δ | Δ |

Embodiment 16

| | |
|---|---|
| $K_4P_2O_7$ | 330 g/l |
| $Sn_2P_2O_7$ | 103 g/l |
| AgI | 1.2 g/l |
| KI | 250 g/l |
| Sodium lauryl sulfate | 0.5 g/l |

A tin-silver alloy plating solution including the above compounds is prepared. The plating solution is a colorless and transparent solution, with a pH=9.2. Pure copper substrates are electroplated with direct current in the plating solution at a temperature of 80° C. with no stirring and a cathodic current density of 0.5–3.0 A/dm$^2$. The amount of silver (WT %) in a tin-silver alloy layer, the current efficiency and the external appearance of the alloy layer (Δ is gray and no glossy; ☉ is white and no glossy; and ☉ is white and half glossy) with respect to the current density are shown in TABLE 12. According to the TABLE, the tin-silver alloy layer, which includes 1.4–5.2% of silver, can be formed in the plating solution.

TABLE 12

| Current Density (A/dm$^2$) | 0.5 | 1.0 | 1.5 | 2.0 | 3.0 |
|---|---|---|---|---|---|
| Amount of Silver (%) | 5.2 | 2.6 | 1.8 | 1.7 | 1.4 |
| External Appearance | ○ | ○ | ○ | Δ | Δ |

Embodiment 17

| | |
|---|---|
| $K_4P_2O_7$ | 250 g/l |
| $Sn_2P_2O_7$ | 62 g/l |
| AgI | 0.7 g/l |
| KI | 250 g/l |
| Salicylic acid | 50 g/l |

A tin-silver alloy plating solution including the above compounds is prepared. The plating solution is a colorless and transparent solution with a pH=6.6. Pure copper substrates are electroplated with direct current in the plating solution at a temperature of 25° C. with no stirring and a cathodic current density of 0.1–1.5 A/dm$^2$. The amount of silver (WT %) in a tin-silver alloy layer, the current efficiency and the external appearance of the alloy layer (Δ is gray and no glossy; ○ is white and no glossy; and ☉ is white and half glossy) with respect to the current density are shown in TABLE 13. According to the TABLE, the tin-silver alloy layer, which is white and half glossy, can be formed in the plating solution.

TABLE 13

| Current Density (A/dm$^2$) | 0.1 | 0.2 | 0.5 | 1.0 | 1.5 |
|---|---|---|---|---|---|
| Amount of Silver (%) | 1.3 | 1.2 | 1.0 | 1.0 | 1.0 |
| External Appearance | ☉ | ☉ | ☉ | ☉ | ☉ |

Embodiment 18

| | |
|---|---|
| $K_4P_2O_7$ | 250 g/l |
| $SnCl_2 \cdot 2H_2O$ | 68 g/l |
| AgI | 0.7 g/l |
| KI | 250 g/l |
| N,N-dimethylformamide | 100 g/l |

A tin-silver alloy plating solution including the above compounds is prepared. The plating solution is a colorless and transparent solution with a pH=8.9. Pure copper substrates are electroplated with direct current in the plating solution a temperature of 25° C. with no stirring and a cathodic current density of 0.1–1.0 A/dm$^2$. The amount of silver (WT %) in the tin-silver alloy layer, the current efficiency and the external appearance of the alloy layer (Δ is gray and no glossy; ○ is white and no glossy; ☉ is white and half glossy; and ☆ is glossy) with respect to the current density are shown in TABLE 14. According to the TABLE, the glossy tin-silver alloy layer can be formed in the plating solution.

TABLE 14

| Current Density (A/dm$^2$) | 0.1 | 0.2 | 0.5 | 0.8 | 1.0 |
|---|---|---|---|---|---|
| Amount of Silver (%) | 1.3 | 1.2 | 1.1 | 1.1 | 1.1 |
| External Appearance | Δ | Δ | ☆ | ☆ | ○ |

Embodiment 19

The alloy plating solution of Embodiment 8 is prepared and pure copper substrates are electroplated with direct current, in the plating solution at a temperature of 25° C. with stirring by a stirrer. The current density, the amount of silver (WT %) in the alloy layer, the current efficiency and the external appearance of the alloy layer (○ is white and no glossy; and ⊛ is white and half glossy) are shown in TABLE 15. In spite of the stirring, the external appearance of the plating solution did not change.

TABLE 15

| Current Density (A/dm$^2$) | 2 | 3 | 4 | 5 | 6 | 7 | 8 | 10 | 11 |
|---|---|---|---|---|---|---|---|---|---|
| Amount of Silver (%) | 8.0 | 4.9 | 3.7 | 3.1 | 2.5 | 2.4 | 2.1 | 1.6 | 1.6 |
| The Current Efficiency (%) | 97 | 99 | 98 | 100 | 100 | 100 | 100 | 97 | 92 |
| External Appearance | ○ | ○ | ○ | ○ | ○ | ○ | ⊛ | ⊛ | ○ |

Embodiment 20

Pyrophosphoric acid is added to the plating solution of the Embodiment 8 to adjust the pH from 8.9 to 7. Then pure copper substrates are electroplated with direct current in the plating solution at a temperature of 25° C. with no stirring and with stirring by a stirrer. The thickness of the alloy layer is 6–7 μm. The current density, the amount of silver (WT %) in the alloy layer, the current efficiency and the external appearance of the alloy layer (○ is white and no glossy; and ⊛ is white and lf glossy) are shown in TABLE 16. In spite of adjusting the pH and the stir, the external appearance of the plating solution did not change.

TABLE 16

| Current Density (A/dm$^2$) | 0.5 | 1 | 1.5 | 3 | 5 | 8 |
|---|---|---|---|---|---|---|
| No Stir | | | | | | |
| Amount of Silver (WT %) | 6.3 | 3.0 | 1.8 | | | |
| Current Efficiency (%) | 98 | 93 | 98 | | | |
| External Appearance | ○ | ○ | ○ | | | |
| Stir by Stirer | | | | | | |
| Amount of Silver (WT %) | | | | 6.0 | 3.4 | 2.2 |
| Current Efficiency (%) | | | | 95 | 96 | 99 |
| External Appearance | | | | ○ | ○ | ○ |

Embodiment 21

The alloy plating solution of the Embodiment 8 is air-stirred, but the external appearance of the plating solution did not change. Pure copper substrates are electroplated, based on Hull cell test, with direct current, in the plating solution of the Embodiment 8 at a temperature of 25° C. The current density, the amount of silver (WT %) in the alloy layer and the external appearance of the alloy layer (○ is white and no glossy; and ⊛ is white and half glossy) are shown in TABLE 17.

TABLE 17

| Current Density (A/dm$^2$) | 0.5 | 1 | 2 | 4 | 6 | 8 | 10 |
|---|---|---|---|---|---|---|---|
| Amount of Silver (%) | 34.5 | 12.1 | 5.5 | 2.6 | 2.3 | 1.7 | 1.6 |
| External Appearance | ○ | ○ | ○ | ○ | ○ | ○ | ○ |

Embodiment 22

A tin-silver alloy layer (amount of silver: 3.3 WT %), whose thickness is about 80 μm, is formed in the plating solution of the Embodiment 8, and a sectional face of the alloy layer is analyzed by an electron probe X-ray micro analyzer. The composition of the alloy layer is uniformly formed in the direction of the thickness.

Embodiment 23

A tin-silver alloy layer including 3.5 WT % of silver is formed on a pure copper substrate in the plating solution of Embodiment 8, on the basis of the Hull cell test, at a temperature of 25° C. with stirring (air-stirring and stirring by the stirrer). The adhesivability of the alloy layer is tested by a bending test of JIS-H-8504 so that no separation and no expansion are observed.

Embodiment 24

The melting point of a tin-silver alloy ingot (made by Senju Kinzoku Corporation), which is made by casing and which includes 3.5 WT % of silver, and that of the tin-silver alloy layers (including 2–5 WT % of silver) formed in the plating solution of Embodiment 8 are observed by a thermal analyzer (DSC). The melting point (temperature of beginning to melt) of all of the tin-silver alloy layers are 221° C., which is equal to the melting point of the casted tin-silver alloy ingot (including 3.5 WT % of silver).

Embodiment 25

A pure copper substrate, whose size is 5×30×0.5 mm, is plated in the plating solution of Embodiment 8 under conditions to be described later. A solderability test of the copper substrate plated with a tin-sliver alloy is executed by a solder checker (type: SAT-2000 made by Rhesca Corporation), using tin-silver solder (including 3.5 WT % of silver) at a temperature 250° C. with 30%-WW rosin or no rinse type flux. As a result of the test, the plated layer has good wettability without a dewetting of the soft solder.

The plating conditions are:

| | |
|---|---|
| Cathode Current Density | 1.5–2.5 A/dm$^2$; |
| Temperature of Solution | 20 or 50° C.; |
| Stir | no stir or stir by the stirer; and |
| Thickness of The Layer | about 6 μm. |

Embodiment 26

Pure copper substrates, whose size is 5×30×0.5 mm, are entirely plated, namely plated 30 mm from the end, in the plating solution of Embodiment 8. The solderability test of the copper substrates plated with a tin-silver alloy are conducted in the air by a solder checker (type: SAT-2000 made by Rhesca Corporation), using tin-silver as a codeposition solder (including 3.5 WT % of silver) at a temperature of 250 ° C. with 30%-WW rosin and a soaking depth of 4 mm. The relationship between the thickness of the tin-silver alloy layer, which includes 3.0 WT % of silver, and the wetting time is shown in TABLE 18. The relationship between the composition of the tin-silver alloy layer (thickness: about 6 μm) and the wetting time is shown in TABLE 19. After the solderability test, the soaked part of the substrate has a good glossy external appearance without dewetting the soft solder.

TABLE 18

| Thickness (μm) | 0.5 | 1 | 2.5 | 5 | 10 |
|---|---|---|---|---|---|
| Wetting Time (sec.) | 1.74 | 1.76 | 1.72 | 1.69 | 1.67 |

TABLE 19

| Amount of Silver (WT %) | 2.8 | 3.1 | 5.0 | 7.3 | 18.4 |
|---|---|---|---|---|---|
| Wetting Time (sec.) | 1.68 | 1.69 | 1.88 | 1.92 | 1.95 |

Embodiment 27

A photo-sensitive resin film (a resist film layer), whose thickness is about 25 μm, is formed on a pure copper substrate. Fifty rows and lines of holes, namely 2500 holes, each of which having a diameter of 100 μm, are longitudinally and latitudinally arranged with a space of 100 μm and are bored in the resist film layer by photo-lithograph so that the copper surfaces are exposed as inner bottom faces of the holes. About 25 μm thick tin-silver alloy layers are formed on the exposed copper surfaces using the tin-silver alloy plating solution of Embodiment 8, a current density of 1.5 A/dm$^2$, no stirring and a temperature of 25° C. After forming the alloy layers, the resist film layer is removed and the plated parts (the tin-silver alloy parts) are observed by an electron microscope. The alloy layers are correctly formed along the inner shapes of the holes. The composition of the alloy layers are analyzed by an electron probe X-ray micro analyzer. The alloy layers are tin-silver layers including 2.8 WT % of silver with the thickness of the alloy layers being almost equal.

The pH of the plating solution of Embodiment 8 is 8.9, but the resist film layer is not removed therein.

Note that a non-photosensitive resist film layer may be employed. In this case, the resist film layer may be formed into desired patterns by laser, e.g., excimer laser.

A semiconductor chip is plated with the tin-silver alloy layer as well. Then the alloy layers are melted in a hydrogen atmosphere, and formed into hemispheres. The hemispherical alloy can be employed as electric terminals (bumps) for flip chip connection of the semiconductor chip.

A plastic substrate (e.g., BGA (Ball Grid Alley)), on which copper printed circuits are formed, is selected as a work to be plated, and the resist film layer is formed to cover the plastic substrate except for some parts of the patterns at which the electric terminals are formed. Then the exposed parts are plated with the tin-silver alloy layers to form the electric terminals (bumps).

Note that the bump forming area of patterns, e.g., gold plated patterns, which have been formed on the surface of the polyimide film, also may be plated to form the bumps.

Embodiment 28

A photo-sensitive resin film (a resist film layer), whose thickness is about 25 μm, is formed on a pure copper substrate. Fifty rows and lines of holes, namely 2500 holes, each of which having a diameter of 100 μm are longitudinally and latitudinally arranged with a space of 100 μm and are bored into the resist film layer by photo-lithograph so that the copper surfaces are exposed as inner bottom faces of the holes. Nickel layers are formed on the exposed copper surfaces about 5 μm thick. Then tin-silver alloy layers are formed on the nickel layer using the tin-silver alloy plating solution of Embodiment 8; a current density 2.0 A/dm$^2$, no stirring a temperature of 25° C. and a supplied quantity of electricity, 50° C./cm$^2$. After forming the alloy layers, the resist film layer is removed. Then the plated alloy parts are observed by an electron microscope. The alloy layers are thicker than the resist film layer and they are formed like mushrooms (the diameter of the parts projected from the surface of the resist film layer are greater than that of the holes). The mushroom-shaped alloy layers are melted in a hydrogen atmosphere and are formed into hemispheres having a diameter of 100 μm and a height of 70 μm. The hemispherical alloy is analyzed by a electron probe X-ray micro analyzer. The tin and silver were found to be uniformly distributed in the hemispherical alloy with the amount of the silver being 3.0 WT %.

Note that, non-photosensitive resist film layer may be employed. In this case, the resist film layer may be formed into desired patterns by laser, e.g., excimer laser.

A semiconductor chip is plated with the tin-silver alloy layer as well. Then the alloy layers are melted in a hydrogen atmosphere where they are formed into hemispheres. The hemispherical alloy can be employed as electric terminals (bumps) for the flip chip connection of the semiconductor chip.

A plastic substrate (e.g., BGA (Ball Grid Alley)), on which copper printed circuits are formed, is selected as a work to be plated, and the resist film layer is formed to cover the plastic substrate, except some parts of the patterns, at which electric terminals are formed, then the exposed parts are plated with nickel and further plated with the tin-silver alloy to form the electric terminals (bumps).

Note that, the bump forming area of patterns, e.g., gold plated patterns, which have been formed on a surface of polyimide film, may be plated as well to form the bumps.

EFFECTS OF THE INVENTION

In the aqueous solution for forming metallic complexies of the present invention, many kinds of metals can be stabilized complex ions. Namely, in the present invention, the combination of the two compounds which mutually never cause a bad influence and which provide an effective complexing function for many kinds of metals, is novel and quite advantageous.

On the other hand, in the tin-silver alloy plating solution of the present invention, the tin-silver alloy plating layers, which have an optional composition, can be formed with high current efficiency and without using harmful cyanides, so that the plating solution is more advantageous than conventional cyanic tin-silver plating solutions. The plating solution of the present invention is resistive to air-stirring, the plating solution is very stable, and the external shape, the adhesivability and the solder-wettability of the tin-silver alloy layer are satisfactory. Thus, the alloy of the present invention, which includes no harmful lead, is more advantageous than the conventional tin-lead solder alloys.

Bumps or electric terminals can be properly formed on semiconductor chips or printed circuits on substrates by the tin-silver alloy plating solution of the present invention.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. A tin-silver alloy plating solution used in the electrodeposition of a tin-silver alloy in an article with a high current efficiency and without using a cyanide material, said plating solution comprising a tin compound, a silver compound, and a complexing agent, said complexing agent including a pyrophosphoric compound and an iodic compound.

2. The tin-silver alloy plating solution according to claim 1, wherein said pyrophosphoric compound includes pyrophosphate, pyrophosphoric acid or a mixture thereof.

3. The tin-silver alloy plating solution according to claim 1, wherein said iodic compound includes iodide, iodite, iodine or a mixture thereof.

4. The tin-silver alloy plating solution according to claim 1, wherein said tin compound includes a tin compound of an inorganic acid or a tin compound of an organic acid, and wherein said silver compound includes a silver compound of an inorganic acid or a silver compound of an organic acid.

5. The tin-silver alloy plating solution according to claim 4, wherein said tin compound is a tin compound of an inorganic acid or a tin compound of an organic acid which is selected from the group consisting of tin chloride, tin sulfate, tin pyrophosphate, tin iodide, stannic acid, potassium stannate, tin acetate, tin methanesulfonate, tin alkanolsulfonate, and tin phenolsulfonate.

6. The tin-silver alloy plating solution according to claim 4, wherein said silver compound is a silver compound of an in organic acid or a silver compound of an organic acid which is selected from the group consisting of silver iodide, silver chloride, silver nitrate, silver sulfate, silver pyrophosphate, silver iodate, silver acetate, silver methanesulfonate, silver alkanolsulfonate, and silver phenolsulfonate.

7. A method of electrolytic plating which comprises electrodepositing a tin-silver alloy on an article from a that plating solution containing a tin compound, a silver compound, and a complexing agent containing a pyrophosphoric compound and an iodic compound.

8. A method of electrolytic plating, which comprises:

forming a resin layer on a surface of an article;

transforming the resin layer into a selected pattern as a plating mask; and electrolytically plating the surface of the article in a plating solution containing a tin compound, a silver compound, and a complexing agent including a pyrophosphoric compound and an iodic compound.

9. The method of plating according to claim 8, wherein the resin layer is a layer of photosensitive resin, and the photosensitive resin layer is formed into the selected pattern by photolithography.

10. The method of plating according to claim 8, wherein the article is a semiconductor chip containing connecting terminals, and the connecting terminals are plated with the tin-silver alloy.

11. The method of plating according to claim 8, wherein the article is a substrate containing printed circuits and connecting terminals connected to the printed circuits, said connecting terminals being plated with the tin-silver alloy.

12. The method of plating according to claim 8, which further comprises the step of heat treating the plated article.

13. The method of plating according to claim 8, wherein said pyrophosphoric compound includes pyrophosphate, pyrophosphoric acid or a mixture thereof.

14. The method of plating according to claim 8, wherein said iodic compound includes iodide, iodite, iodine, or a mixture thereof.

15. The method of plating according to claim 8, wherein said tin compound includes a tin compound of an inorganic acid or a tin compound of an organic acid and said silver compound includes a silver compound of an inorganic acid or a silver compound of an organic acid.

16. The method of plating according to claim 15, wherein the tin compound is at least one member selected from the group consisting of tin chloride, tin sulfate, tin pyrophosphate, tin iodide, stannic acid, potassium stannate, tin acetate, tin methanesulfonate, tin alkanolsulfonate, and tin phenolsulfonate.

17. The method of plating according to claim 15, wherein said silver compound is at least one member selected from the group consisting of silver iodide, silver chloride, silver nitrate, silver sulfate, silver pyrophosphate, silver iodate, silver acetate, silver methanesulfonate, silver alkanolsulfonate, and silver phenolsulfonate.

* * * * *